(12) United States Patent
Jiang et al.

(10) Patent No.: US 8,698,084 B2
(45) Date of Patent: Apr. 15, 2014

(54) THREE DIMENSIONAL SENSORS, SYSTEMS, AND ASSOCIATED METHODS

(75) Inventors: Jutao Jiang, Tigard, OR (US); Jeffrey McKee, Tualatin, OR (US); Homayoon Haddad, Beaverton, OR (US); Chris Sungkwon Hong, Lake Oswego, OR (US)

(73) Assignee: SiOnyx, Inc., Beverly, MA (US)

( * ) Notice: Subject to any disclaimer, the term of this patent is extended or adjusted under 35 U.S.C. 154(b) by 171 days.

(21) Appl. No.: 13/418,226

(22) Filed: Mar. 12, 2012

(65) Prior Publication Data
US 2013/0062522 A1 Mar. 14, 2013

Related U.S. Application Data

(60) Provisional application No. 61/451,510, filed on Mar. 10, 2011.

(51) Int. Cl.
*G01J 5/02* (2006.01)
*H01L 27/14* (2006.01)

(52) U.S. Cl.
USPC .............. 250/339.05; 250/338.4; 257/431

(58) Field of Classification Search
USPC ............. 250/338.1, 338.4, 339.01, 339.05; 257/431, 432
See application file for complete search history.

(56) References Cited

U.S. PATENT DOCUMENTS

| | | | |
|---|---|---|---|
| 3,487,223 A | 12/1969 | St. John | |
| 4,277,793 A | 7/1981 | Webb | |
| 4,419,533 A | 12/1983 | Czubatyj et al. | |
| 4,493,942 A | 1/1985 | Sheng et al. | |
| 4,514,582 A | 4/1985 | Tiedje et al. | |
| 4,536,608 A | 8/1985 | Sheng et al. | |
| 4,663,188 A | 5/1987 | Kane | |
| 4,829,013 A | 5/1989 | Yamazaki | |
| 5,080,725 A | 1/1992 | Green et al. | |
| 5,081,049 A | 1/1992 | Green et al. | |
| 5,100,478 A | 3/1992 | Kawabata | |
| 5,114,876 A | 5/1992 | Weiner | |
| 5,164,324 A | 11/1992 | Russell et al. | |
| 5,322,988 A | 6/1994 | Russell et al. | |

(Continued)

FOREIGN PATENT DOCUMENTS

| AU | 3666484 | 6/1985 |
|---|---|---|
| GB | 2030766 | 4/1980 |

(Continued)

OTHER PUBLICATIONS

Berger, Michael; Moth Eyes Inspire Self-Cleaning Antireflection Nanotechnology Coatings; 2008; 3 pages; Nanowerk LLC.

(Continued)

*Primary Examiner* — Mark R Gaworecki
(74) *Attorney, Agent, or Firm* — Thorpe North & Western LLP

(57) ABSTRACT

3D sensors, systems, and associated methods are provided. In one aspect, for example, a monolithic 3D sensor for detecting infrared and visible light can include a semiconductor substrate having a device surface, at least one visible light photodiode formed at the device surface and at least one 3D photodiode formed at the device surface in proximity to the at least one visible light photodiode. The device can further include a quantum efficiency enhanced infrared light region functionally coupled to the at least one 3D photodiode and positioned to interact with electromagnetic radiation. In one aspect, the quantum efficiency enhanced infrared light region is a textured region located at the device surface.

24 Claims, 11 Drawing Sheets

(56) References Cited

U.S. PATENT DOCUMENTS

| | | | |
|---|---|---|---|
| 5,346,850 | A | 9/1994 | Kaschmitter et al. |
| 5,373,182 | A | 12/1994 | Norton |
| 5,597,621 | A | 1/1997 | Hummel et al. |
| 5,714,404 | A | 2/1998 | Mititsky et al. |
| 5,731,213 | A | 3/1998 | Ono |
| 5,792,280 | A | 8/1998 | Ruby et al. |
| 6,147,297 | A | 11/2000 | Wettling et al. |
| 6,379,979 | B1 | 4/2002 | Connolly |
| 6,580,053 | B1 | 6/2003 | Voutsas |
| 6,583,936 | B1 | 6/2003 | Kaminsky et al. |
| 6,667,528 | B2 | 12/2003 | Cohen et al. |
| 6,759,262 | B2 | 7/2004 | Theil et al. |
| 6,800,541 | B2 | 10/2004 | Okumura |
| 7,057,256 | B2 | 6/2006 | Carey, III et al. |
| 7,091,411 | B2 | 8/2006 | Falk et al. |
| 7,109,517 | B2 | 9/2006 | Zaidi |
| 7,132,724 | B1 | 11/2006 | Merrill |
| 7,247,527 | B2 | 7/2007 | Shimomura et al. |
| 7,314,832 | B2 | 1/2008 | Kountz et al. |
| 7,354,792 | B2 | 4/2008 | Carey, III et al. |
| 7,390,689 | B2 | 6/2008 | Mazur et al. |
| 7,442,629 | B2 | 10/2008 | Mazur et al. |
| 7,456,452 | B2 | 11/2008 | Wells et al. |
| 7,482,532 | B2 | 1/2009 | Yi et al. |
| 7,498,650 | B2 | 3/2009 | Lauxtermann |
| 7,504,325 | B2 | 3/2009 | Koezuka et al. |
| 7,504,702 | B2 | 3/2009 | Mazur et al. |
| 7,511,750 | B2 | 3/2009 | Murakami |
| 7,745,901 | B1 | 6/2010 | McCaffrey et al. |
| 7,781,856 | B2 | 8/2010 | Mazur et al. |
| 7,816,220 | B2 | 10/2010 | Mazur et al. |
| 7,847,253 | B2 | 12/2010 | Carey et al. |
| 7,884,439 | B2 | 2/2011 | Mazur et al. |
| 7,884,446 | B2 | 2/2011 | Mazur et al. |
| 8,030,726 | B2 | 10/2011 | Sumi |
| 8,058,615 | B2 | 11/2011 | McCaffrey |
| 8,207,051 | B2 | 6/2012 | Sickler et al. |
| 8,476,681 | B2 | 7/2013 | Haddad et al. |
| 2003/0029495 | A1 | 2/2003 | Mazur et al. |
| 2003/0030083 | A1 | 2/2003 | Lee et al. |
| 2004/0222187 | A1 | 11/2004 | Lin |
| 2005/0127401 | A1 | 6/2005 | Mazur et al. |
| 2005/0227390 | A1 | 10/2005 | Shtein et al. |
| 2006/0011955 | A1 | 1/2006 | Baggenstoss |
| 2006/0079062 | A1 | 4/2006 | Mazur et al. |
| 2006/0118781 | A1 | 6/2006 | Rhodes |
| 2006/0231914 | A1 | 10/2006 | Carey, III et al. |
| 2007/0145505 | A1 | 6/2007 | Kim et al. |
| 2008/0026550 | A1 | 1/2008 | Werner et al. |
| 2008/0044943 | A1 | 2/2008 | Mazur et al. |
| 2008/0076240 | A1 | 3/2008 | Veschtti et al. |
| 2008/0099804 | A1 | 5/2008 | Venezia |
| 2008/0178932 | A1 | 7/2008 | Den Boer et al. |
| 2008/0258604 | A1 | 10/2008 | Mazur et al. |
| 2009/0065051 | A1 | 3/2009 | Chan et al. |
| 2009/0142879 | A1 | 6/2009 | Isaka et al. |
| 2009/0160983 | A1 | 6/2009 | Lenchenkov |
| 2009/0194671 | A1 | 8/2009 | Nozaki et al. |
| 2009/0200845 | A1 | 8/2009 | Mao et al. |
| 2009/0213883 | A1 | 8/2009 | Mazur et al. |
| 2010/0037952 | A1 | 2/2010 | Lin |
| 2010/0052088 | A1 | 3/2010 | Carey |
| 2010/0055887 | A1 | 3/2010 | Piwczyk |
| 2010/0072349 | A1 | 3/2010 | Veeder |
| 2010/0074396 | A1 | 3/2010 | Schmand et al. |
| 2010/0097609 | A1 | 4/2010 | Jaeger et al. |
| 2010/0143744 | A1 | 6/2010 | Gupta |
| 2010/0219506 | A1 | 9/2010 | Gupta |
| 2010/0224229 | A1 | 9/2010 | Pralle et al. |
| 2010/0240169 | A1 | 9/2010 | Petti et al. |
| 2010/0264473 | A1 | 10/2010 | Adkisson et al. |
| 2010/0290668 | A1 | 11/2010 | Friedman et al. |
| 2010/0300505 | A1 | 12/2010 | Chen |
| 2011/0073976 | A1 | 3/2011 | Vaillant |
| 2011/0220971 | A1 | 9/2011 | Hadda |
| 2011/0227138 | A1 | 9/2011 | Hadda |
| 2011/0266644 | A1 | 11/2011 | Yamamura et al. |
| 2011/0303999 | A1 | 12/2011 | Sakamoto et al. |
| 2012/0024364 | A1 | 2/2012 | Carey et al. |
| 2012/0111396 | A1 | 5/2012 | Saylor et al. |
| 2012/0171804 | A1 | 7/2012 | Moslehi et al. |
| 2012/0313204 | A1 | 12/2012 | Haddad et al. |
| 2012/0313205 | A1 | 12/2012 | Haddad et al. |
| 2013/0082343 | A1 | 4/2013 | Fudaba et al. |

FOREIGN PATENT DOCUMENTS

| | | |
|---|---|---|
| JP | 63116421 | 5/1988 |
| JP | 2152226 | 6/1990 |
| JP | 07/173484 | 7/1995 |
| JP | 9298308 | 11/1997 |
| JP | 2008/187003 | 8/2008 |
| KR | 2001/0061058 | 4/2001 |
| KR | 2010/0118864 | 11/2010 |
| WO | WO 2006/086014 | 8/2006 |
| WO | WO 2009/100023 | 8/2009 |
| WO | WO 2011/035188 | 3/2011 |

OTHER PUBLICATIONS

Boden, S.A. et al.; Nanoimprinting for Antireflective Moth-Eye Surfaces; 4 pages; 2008.

Buttgen, B.; "Demodulation Pixel Based on Static Drift Fields"; IEEE Transactions on Electron Devices, vol. 53, No. 11, Nov. 2006.

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS; 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Carey, III; "Femtosecond-laser Microstructuring of Silicon for Novel Optoelectronic Devices"; Harvard University, Jul. 2004; (Thesis).

Chen, Q. et al.; Broadband moth-eye antireflection coatings fabricated by low-cost nanoimprinting; Applied Physics Letters 94; pp. 263118-1-263118-3; 2009; American Institute of Physics.

Chien et al, "Pulse Width Effect in Ultrafast Laser Processing of Materials," Applied Physics A, 2005, 1257-1263, 81, Springer Berlin, Heidelberg, Germany.

Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.

Crouch et al., "Comparison of Structure and Properties of Femtosecond and Nanosecond Laser-Structured Silicon" Appl. Phys. Lett., 2004, 84,1850-1852.

Crouch et al., "Infrared Absorption by Sulfur-Doped Silicon Formed by Femtosecond Laser Irradiation", Appl. Phys. A, 2004, 79, 1635-1641.

Despeisse, et al.; "Thin Film Silicon Solar Cell on Highly Textured Substrates for High Conversion Efficiency"; 2004.

Dewan, Rahul et al.; Light Trapping in Thin-Film Silicon Solar Cells with Submicron Surface Texture; Optics Express; vol. 17, No. 25; Dec. 7, 2009; Optical Society of America.

Dobie, et al.; "Minimization of reflected light in photovoltaic modules"; Mar. 1, 2009.

Dobrzanski, L.A. et al.; Laser Surface Treatment of Multicrystalline Silicon for Enhancing Optical Properties; Journal of Materials Processing Technology; p. 291-296; 2007; Elsevier B.V.

Duerinckx, et al.; "Optical Path Length Enhancement for >13% Screenprinted Thin Film Silicon Solar Cells"; 2006.

(56) References Cited

OTHER PUBLICATIONS

Dolgaev et al., "Formation of Conical Microstructures Upon Laser Evaporation of Solids", Appl. Phys. A, 2001, 73, 177-181.

Dulinski, Wojciech; "Tests of a backside illuminated monolithic CMOS pixel sensor in an HPD set-up"; Nuclear Instruments and Methods in Physics Research Section A ; Apr. 1, 2005.

Forbes; "Texturing, reflectivity, diffuse scattering and light trapping in silicon solar cells"; 2012.

Fowlkes et al., "Surface Microstructuring and Long-Range Ordering of Silicon Nanoparticles", Appl. Phys. Lett., 2002, 80 (20), 3799-3801.

Gjessing, J. et al.; 2D back-side diffraction grating for impored light trapping in thin silicon solar cells; Optics Express; vol. 18, No. 6; pp. 5481-5495; Mar. 15, 2010; Optical Society of America.

Goetzberger, et al.; "Solar Energy Materials & Solar Cells"; vol. 92 (2008) pp. 1570-1578.

Haug, et al.; "Light Trapping effects in thin film silicon solar cells"; 2009.

Her et al., "Microstructuring of Silicon with Femtosecond Laser Pulses," Applied Physics Letters, 1998, 1673-1675, vol. 73, No. 12, American Institute of Physics.

Her et al., "Novel Conical Microstructures Created in Silicon With Femtosecond Laser Pulses", CLEO 1998, 511-512, San Francisco, CA.

Her, et al., "Femtosecond laser-induced formation of spikes on silicon," Applied Physics A, 2000, 70, 383-385.

Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.

Huang, et al.; "Microstructured silicon photodetector"; Applied Physics Letters 89, 033506; 2006 American Institute of Physics; 2000.

Hüpkes, J. et al.; Light Scattering and Trapping in Different Thin Film Photovoltaic Devices; 24$^{th}$ European Photovoltaic Solar Energy Conference, Hamburg, Germany (Sep. 21-25, 2009); pp. 2766-2769.

Joy, T. et al.; Development of a Production-Ready, Back-Illuminated CMOS Image Sensor with Small Pixels; Electron Devices Meeting; pp. 1007-1010; 2007; IEEE.

Kim et al.; "Strong Sub-Band-Gap Infrared Absorption in Silicon Supersaturated with Sulfur"; 2006 Appl. Phys. Lett. 88, 241902-1-241902-3.

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al.; X-ray Imaging Systems for NDT and General Applications; 2002; Fraunhofer Institute for Nondestructive Testing; Saarbrucken and Dresden, Germany; 18 pages.

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA; 2005.

Lin, A. et al.; Optimization of Random Diffraction Gratings in Thin-Film Solar Cells Using Genetic Algorithms; 2007; 1 page; SSEL Annual Report; 2007.

Madzhaov, et al.; "Light trapping in thin-firm silicon solar cells for superstrate and substrate configuration" Abstract #1614, 218$^{th}$ ECS Meeting © 2010 the Electrochemical Society.

Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.

Matsuno, Shigeru et al.; Advanced Technologies for High Efficiency Photovoltaic Systems; Mitsubishi Electric Advance; vol. 122; pp. 17-19; Jun. 2008.

Moloney, A.M. et al.; Novel Black Silicon PIN Photodiodes; 8 pages; Jan. 25, 2006; SPIE.

Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.

Nayak et al, "Semiconductor Laesr Crystallization of a-Si:H," SPIE Digital Library, 2003, 277-380, vol. 4977, Bellingham, Washington. 2003.

Nayak et al.; "Ultra-Laser-Assisted Chemical Restructuring of Silicon and Germanium Surfaces," 2007, Applied surface Science, 253, 680-6583, Elsevier B.V.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Pain, Bedabrata; "A Back-Illuminated Megapixel CMOS Image Sensor"; http://hdl.handle.net/2014/39312; May 1, 2005.

Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Pedraza et al., "Surface Nanostructuring of Silicon", Appl. Phys. A, 2003, 77, 277-284.

Russell, et al.; "Nanosecond Eximer Laser Processing for Novel Microelectronic Fabrication"; Nanosecond Excimer Laser Processing; 6 pages; 1989.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Sarnet et al.; "Femtosecond laser for black silicon and photovoltaic cells"; Feb. 21, 2008, Proc. of SPIE; vol. 6881; pp. 1-15.

Senoussaoui, N. et al.; Thin-Film Solar Cells with Periodic Grating Coupler; Thin Solid Films; pp. 397-401; 2003; Elsevier B.V.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Szlufcik, et al.; "Simple integral screenprinting process for selective emitter polycrystalline silicon solar cells"; Appl. Phys. Lett. 59 (13); Sep. 23, 1991.

Tabbal et al., "Formation of Single Crystal Sulfur Supersaturated Silicon Based Junctions by Pulsed Laser Melting". 2007, J. Vac. Sci. Technol. B25(6), 1847-1852.

Tower, et al.; "Large format Backside illuminated CCD Imager for Space Surveillance"; IEEE Transactions on electron Devices, vol. 50, No. 1, Jan. 2003.

Tull; "Femtosecond Laser Ablation of Silicon: Nanoparticles, Doping and Photovotaics"; Harvard University, Jun. 2007 (Thesis).

Winderbaum, S. et al.; Reactive ion etching (RIE) as a method for texturing polycrystalline silicon solar cells; Solar Energy Materials and Solar Cells; 1997; pp. 239-248; Elsevier Science B.V.

Wu et al., "Black Silicon: A New Light Absorber," APS Centennial Meeting (Mar. 23, 1999).

(56) References Cited

OTHER PUBLICATIONS

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Wu, et al, "Near-Unity Below-Band-Gap Absorption by Microstructured Silicon," 2001, Applied Physics Letters, 1850-1852, vol. 78, No. 13, American Institute of Physics.

Yablonovitch, et al.; "Intensity Enhancement in Textured Optical Sheets for Solar Cells"; © 1982 IEEE.

Yamamoto, K. et al.; NIR Sensitivity Enhancement by Laser Treatment for Si Detectors; Nuclear Instruments and Methods in Physics Research A; pp. 520-523; Mar. 31, 2010; Elsevier.

Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.

Younkin et al., "Infrared Absorption by Conical Silicon Microstructures Made in a Variety of Background Gases Using Femtosecond-Laser Pulses", J. Appl. Phys., 93, 2626-2629 (2003).

Younkin, "Surface Studies and Microstructure Fabrication Using Femtosecond Laser Pulses," Thesis presented to the Division of Engineering & Applied sciences at Harvard University (Aug. 2001).

Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

Zaidi, S.H. et al.; Diffraction Grating Structures in Solar Cells; Photovoltaic Specialists Conference, 2000; 4 pages; Sep. 2000; IEEE.

PCT/US2012/028822; filed Mar. 12, 2012; Sionyx, Inc. et al.; international search report dated Nov. 23, 2012.

U.S. Appl. No. 12/885,158; filed Sep. 17, 2010; Homayoon Haddad; notice of allowance issued Nov. 8, 2013.

| Red pixel | Green pixel | Red pixel | Green pixel |
| --- | --- | --- | --- |
| Green pixel | Blue pixel | Green pixel | Blue pixel |
| 3D TOF_1 | | 3D TOF_1 | |
| | 3D TOF_2 | | 3D TOF_2 |
| Red pixel | Green pixel | Red pixel | Green pixel |
| Green pixel | Blue pixel | Green pixel | Blue pixel |
| 3D TOF_1 | | 3D TOF_1 | |
| | 3D TOF_2 | | 3D TOF_2 |

FIG. 6

THREE DIMENSIONAL SENSORS, SYSTEMS, AND ASSOCIATED METHODS

PRIORITY DATA

This application claims the benefit of U.S. Provisional Patent Application Ser. No. 61/451,510, filed on Mar. 10, 2011, which is incorporated herein by reference.

BACKGROUND

The interaction of light with semiconductor devices is at the core of many important innovations. Semiconductor photodetecting devices, such as photovoltaics, photodiodes, imagers, are used in various technologies for example, solar cells, digital cameras, optical mice, video cameras, video game consoles, cell phones, and the like. Silicon is the most prevalent semiconductor for electronic devices, and is also very widely used for optoelectronic devices such as optical detectors, image sensors and solar cells. The bandgap of silicon at room temperature is 1.12 eV, and in general semiconductors do not absorb photons that have energies below their bandgap energy. However, there are many applications that require optical detection at lower energy levels than silicon's bandgap. Of particular interest, for example, are the energy levels 0.95 eV (1310 nm) and 0.8 eV (1550 nm). These applications are typically served by other semiconductors with smaller bandgaps, such as germanium, indium gallium arsenide, mercury cadmium telluride and the like.

SUMMARY

The present disclosure provides 3D sensors, systems, and associated methods. In one aspect, for example, a monolithic 3D sensor capable of detecting infrared and visible light is provided. Such a device can include a semiconductor substrate having a device surface, at least one visible light photodiode formed at the device surface and at least one 3D photodiode formed at the device surface in proximity to the at least one visible light photodiode. The device can further include a quantum efficiency enhanced infrared light region functionally coupled to the at least one 3D photodiode and positioned to interact with electromagnetic radiation. In one aspect, the quantum efficiency enhanced infrared light region is a textured region located at the device surface. In another aspect, the quantum efficiency enhanced infrared light region has surface structures formed using a pulsed laser with a pulse duration of from about 1 femtosecond to about 500 picoseconds. In yet another aspect, the surface structures have an average height of from about 5 nm to about 500 µm.

Various photodiode combinations are contemplated, and any such combination of visible light photodiodes and 3D photodiodes is considered to be within the present scope. In one aspect, for example, the at least one visible light photodiode includes at least one red light-sensitive photodiode, at least one blue light-sensitive photodiode, at least one green light-sensitive photodiode, and at least two 3D photodiodes. In another aspect, the 3D photodiode is operable to detect infrared light having a wavelength of greater than about 800 nm. In yet another aspect, the device can further include an infrared narrow bandpass filter optically coupled to the 3D photodiode and positioned to filter electromagnetic radiation impinging on the 3D photodiode. In a further aspect, the device can include an infrared cut filter optically coupled to the at least one visible light diode and positioned to filter infrared electromagnetic radiation impinging on the at least one visible light photodiode.

The design of the 3D photodiode can vary depending on the desired functionality of the sensor. In one aspect, for example, the 3D photodiode further includes circuitry for capturing signals generated by the 3D photodiode in response to detection of a pulse of infrared light from an infrared light source. In another aspect, the 3D photodiode further includes circuitry for calculating time of flight information. In yet another aspect, the device further includes circuitry for synchronizing light capture of the 3D photodiode with an infrared light source. In a further aspect, the device can include readout circuitry functionally coupled to the at least one visible light photodiode and the at least one 3D photodiode operable to function in global shutter mode.

The present disclosure additionally provides systems for detecting infrared and visible light. In one aspect, such a system can include a monolithic 3D sensor for detecting infrared and visible light, where such a monolithic sensor further includes a semiconductor substrate having a device surface, at least one visible light photodiode formed at the device surface, at least one 3D photodiode formed at the device surface in proximity to the at least one visible light photodiode, and a quantum efficiency enhanced infrared light region functionally coupled to the at least one 3D photodiode and positioned to interact with electromagnetic radiation. The system can also include an infrared light source operable to emit infrared light detectable by the 3D photodiode, and synchronization circuitry between the infrared light source and the 3D photodiode to synchronize detection of infrared light 3D photodiode with a pulse of the infrared light source.

BRIEF DESCRIPTION OF THE DRAWINGS

For a fuller understanding of the nature and advantage of the present disclosure, reference is made to the following detailed description of embodiments herein in connection with the accompanying drawings, in which:

FIG. 6 is an illustration of a pixel arrangement scheme in accordance with one aspect of the present disclosure;

DETAILED DESCRIPTION

Figure 1:
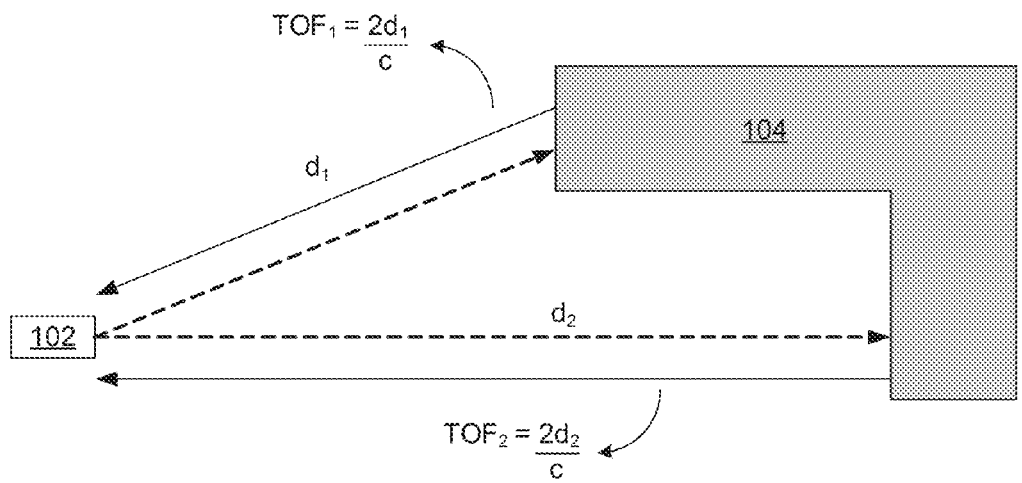
FIG. 1 illustrates basic principles of time of flight (TOF)

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

The following terminology will be used in accordance with the definitions set forth below.

It should be noted that, as used in this specification and the appended claims, the singular forms "a," and, "the" can include plural referents unless the context clearly dictates otherwise. Thus, for example, reference to "a dopant" can include one or more of such dopants and reference to "the layer" can include reference to one or more of such layers.

As used herein, the terms "light" and "electromagnetic radiation" can be used interchangeably and can refer to light or electromagnetic radiation in the ultraviolet, visible, near infrared, and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are longer than about 800 nm or shorter than about 350 nm. The infrared spectrum includes a near infrared portion of the spectrum including wavelengths of approximately 800 to 1100 nm, a short wave infrared portion of the spectrum including wavelengths of approximately 1100 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, "quantum efficiency" (QE) is defined as the percentage of photons incident on an optoelectronic device that are converted into electrons. External QE (EQE) is defined as the current obtained outside of the device per incoming photon. As such, EQE therefore depends on both the absorption of photons and the collection of charges. The EQE is lower than the QE due to recombination effects and optical losses (e.g. transmission and reflection losses).

As used herein, the terms "3D" and "three dimensional" can be used interchangeably, and refer to obtaining distance information from electromagnetic radiation.

As used herein, the terms "disordered surface" and "textured surface" can be used interchangeably, and refer to a surface having a topology with nano- to micron-sized surface variations. Such a surface topology can be formed by the irradiation of a laser pulse or laser pulses, chemical etching, lithographic patterning, interference of multiple simultaneous laser pulses, or reactive ion etching. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 1 μm to about 60 μm). In yet another aspect, the surface can include nano-sized and/or micron-sized structures from about 5 nm and about 500 μm. A variety of techniques can be utilized to measure the size of such structures. For example, for cone-like structures the above ranges are intended to be measured from the peak of a structure to the valley formed between that structure and an adjacent neighboring structure. For structures such as nanopores, the above ranges are intended to be approximate diameters. Additionally, the surface structures can be spaced at various average distances from one another. In one aspect, neighboring structures can be spaced at a distance of from about 50 nm to about 50 μm from. In another aspect, neighboring structures can be spaced at a distance of from about 50 nm to about 2 μm from. Such spacing is intended to be from a center point of one structure to the center point of a neighboring structure.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser irradiation, chemical etching, reactive ion etching, lithographic patterning, etc. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified. The target region of a semiconductor material can vary as the surface modifying process progresses. For example, after a first target region is doped or surface modified, a second target region may be selected on the same semiconductor material.

As used herein, the term "monolithic" refers to an electronic device in which electronic components are formed on the same substrate. For example, two monolithic pixel elements are pixel elements that are formed on the same semiconductor substrate.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

The following disclosure relates to photosensitive diodes, pixels, and imagers capable of detecting visible light as well as infrared light utilized to provide depth information (i.e. 3D information), including associated methods of making such devices. Such device additionally exhibit enhanced absorption and quantum efficiencies. In one aspect, for example, such a 3D imaging device can include at least one first semiconductor pixel, at least one second semiconductor pixel, at least one third semiconductor pixel, and at least one 3D semiconductor pixel that is capable of detecting the distance of an object. This 3D pixel can be monolithically arranged with the other semiconductor pixels. The first, second, third, and 3D semiconductor pixels can be configured to detect light having a first, second, third and fourth wavelength, respectively. Further the first wavelength can be in the range of about 400 nm to about 500 nm; the second wavelength in the range of about 500 nm to about 550 nm; the third wavelength in the range of about 550 nm to about 700 nm and the fourth wavelength in the range of about 700 nm to about 1200 nm. In some aspects, a monolithic sensor can include multiple 3D pixels operable to detect different wavelengths. For example, different 3D pixels can be tuned to specific wavelengths such as, for example, 850 nm, 960 nm, 1064 nm, etc. It can also be beneficial to include multiple 3D pixels operable to detect the same wavelength. As one non-limiting example, a monolithic sensor could include multiple 3D pixels operable to detect at 1064 nm and multiple 3D pixels operable to detect at 960. It should be understood that various arrangements and combinations of pixel types and pixel numbers are contemplated, and any such combination is considered to be within the present scope.

In one embodiment, the 3D semiconductor pixel can include a semiconductor substrate, a semiconductor layer formed at or from the semiconductor substrate, and a quantum efficiency enhanced infrared light region associated with the semiconductor layer. In one aspect, the quantum efficiency enhanced infrared light region can be a textured region. In another aspect, the semiconductor substrate and the semiconductor layer are comprised of silicon.

There are many applications that utilize depth information, non-limiting examples of which can include hands-free gesture control, video games, medical applications, machine vision, and the like. Time-of-flight (TOF) is one exemplary method of determining depth information that has been developed for use in radar and LIDAR (Light Detection and Ranging) systems. The basic principle of TOF involves sending a signal and measuring a property of the returned signal from a target. The measured property is used to determine the TOF. The distance is derived by multiplication of half the TOF and the velocity of the signal in the application medium.

FIG. 1 shows an illustration of generalized TOF measurement with a target having multiple surfaces that are separated spatially. Equation I shows one example of how such distance measurements can be calculated.

$$d = \frac{TOF * c}{2} \qquad \text{I}$$

Where d is the distance measurement and c is the speed of light. By measuring the time (e.g. TOF) that it takes light 102 to travel to and from a target 104, the distance between a light emitting diode (LED) and the surface of the target can be derived. For an imager, if each pixel can perform the above TOF measurement, for a given lens system, a beneficial 3D image of the target can be achieved. Since, the speed of light in a vacuum is $3e^8$ msec, light traveling at that speed will reach a target at 30 cm in a nanosecond. Thus, distance measurements can be difficult with TOF methods when the target is relatively near the source, which is often the case for many 3D imaging applications. One non-limiting example of a method for TOF measurement to overcome this issue utilizes a modulated light pulse and measure the phase delay between emitted light and received light. Based on the phase delay and pulse width, the TOF can be derived. Such a light pulse can be emitted from, for example, an LED light source.

Furthermore, many current pixels or imagers are manufactured on a silicon material that has been epitaxially (EPI) grown. Most epitaxially grown silicon is relatively thin (e.g. less than 30 µm) and is thus limited on the amount of infrared electromagnetic radiation that the material can absorb/detect, rendering pixel quantum efficiency around near infrared and infrared wavelengths poor. To achieve acceptable signal to noise ratio for such devices, high power LED are needed to generate the infrared signal. Without such higher powered LEDs, the potentially measurable distance range is very short, and resulting higher electrical crosstalk can significantly affect the spatial resolution of the depth map. Conversely, if the EPI thickness is increased in such a pixel, the infrared quantum efficiency can be increased, although not to acceptable levels for many applications. Increasing the EPI thickness, however, can significantly slow electron migration and degradation on demodulation performance. This can result in poor depth accuracy or in other words, an increase in depth noise. Pixels according to aspects of the present disclosure overcome problems that have previously been associated with depth measurements. For example, in one aspect, such a device can utilize a silicon EPI layer having a thickness of from about 2 µm to about 5 µm that can achieve high QE in infrared wavelengths.

Figure 2:
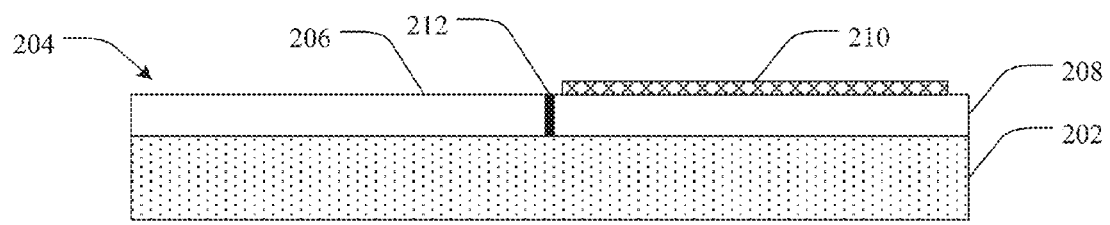
FIG. 2 is cross section view of a monolithic sensor in accordance with one aspect of the present disclosure.

In one exemplary aspect, as is shown in FIG. 2, a monolithic 3D sensor for detecting infrared and visible light is provided. Such a sensor can include a semiconductor substrate 202 having a device surface 204, at least one visible light photodiode 206 formed at or from the device surface 204, and at least one 3D photodiode 208 formed at or from the device surface 204 in proximity to the at least one visible light photodiode 206. Thus the photodiodes in the sensor can be arranged monolithically with respect to one another. The monolithic 3D sensor can also include a quantum efficiency enhanced infrared light region 210 functionally coupled to the at least one 3D photodiode 208 and positioned to interact with electromagnetic radiation. It should be noted that, in some aspects, various layers can separate the quantum efficiency enhanced infrared light region and the 3D photodiode, including, but not limited to, an oxide layer. Thus, the 3D photodiode has enhanced responsivity and/or detectability in the infrared regions of the light spectrum. It is noted that the device surface can be a portion of the semiconductor substrate, or the device surface can be an additional layer, such as an epitaxially grown layer, that is formed on the substrate.

In some aspects, the at least one visible light photodiode 206 and the at least one 3D photodiode 208 can be isolated from one another using a variety of trench isolation 212 or other techniques to lower or eliminate optical and/or electrical crosstalk between the photodiodes. In some aspects, the trench isolation itself can be textured and/or doped as discussed herein. Additionally, the trench isolation can be filled with an oxide material. It is noted that each of the various photodiodes can have multiple doped regions forming at least one junction. In some aspects, doped regions can include an n-type dopant and/or a p-type dopant, thereby creating a p-n junction. In other aspects, a photosensitive device can include an i-type region to form a p-i-n junction. Various dopants and dopant profiles are discussed further herein.

In another aspect, a photodiode can include an electrical transfer element coupled to the semiconductor substrate and operable to transfer an electrical signal from the junction. Non-limiting examples of electrical transfer elements can include a variety of devices such as transistors, transfer gates, MOSFETs, PMOS transfer gates, and the like.

In general, a photodiode can include passive pixel sensors (PPS), active pixel sensors (APS), digital pixel sensor imagers (DPS), or the like, with one difference being the image sensor read out architecture. For example, a semiconducting photodiode can be a three, four, five or six transistor active pixel sensor (3T, 4T, 5T, or 6T APS). Devices having greater than 6 transistors are also within the present scope.

In another aspect of the present disclosure, a 3D optoelectronic device is provided. Such a device can include a semiconductor substrate having a device surface, at least one 3D photodiode formed at the device surface, and a quantum efficiency enhanced infrared light region functionally coupled to the at least one 3D photodiode and positioned to interact with electromagnetic radiation.

Figure 3:
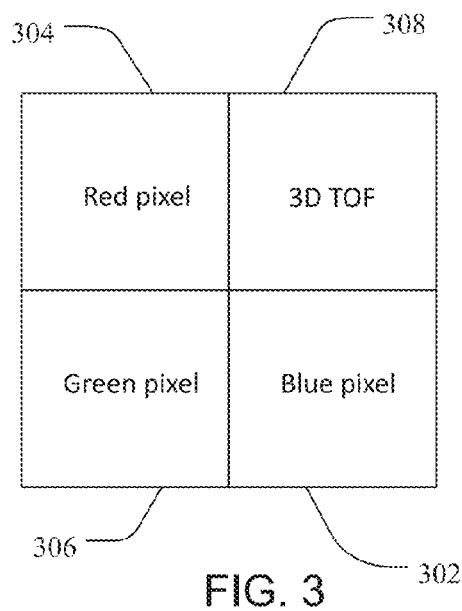
FIG. 3 is an illustration of a pixel arrangement scheme in accordance with one aspect of the present disclosure.
Figure 4:
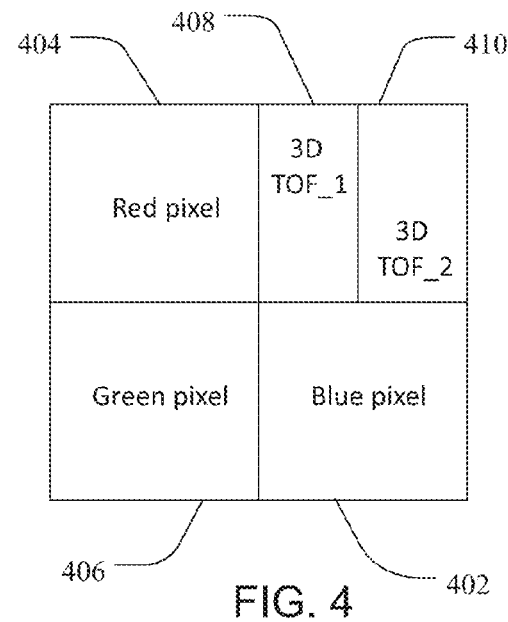
FIG. 4 is an illustration of a pixel arrangement scheme in accordance with one aspect of the present disclosure.

Regarding the layout of a monolithic sensor or monolithic sensor array, a variety of configurations are considered. It should be noted that numerous combinations of visible light photodiodes (or pixels) and 3D photodiodes (or pixels) are possible, and any such combination is considered to be within the present scope. For example, FIG. 3 shows in one aspect a basic pixel array arrangement that is similar to a "Bayer" pattern found in color sensors. A Bayer pattern typically has a red pixel, a blue pixel, and two green pixels located in opposite corners of the pattern. As can be seen in FIG. 3, a similar layout can include one blue pixel 302, one red pixel 304, one green pixel 306, and one 3D pixel 308. FIG. 4 shows an arrangement with one blue pixel 402, one red pixel 404, one green pixel 406, and two 3D pixel 408, 410 (3D TOF_1, and 3D TOF_2). Having multiple 3D pixels, such as the combination of two 3D pixels, can allows for better depth perception. In some aspects, the arrangements in FIGS. 3 and 4 can be beneficial for large pixel designs.

Figure 5:
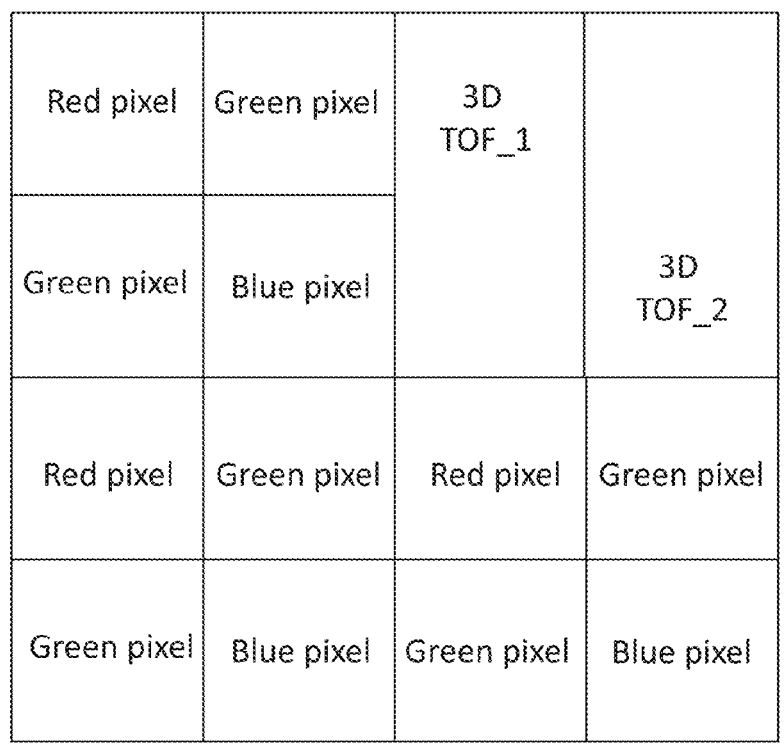
FIG. 5 is an illustration of a pixel arrangement scheme in accordance with one aspect of the present disclosure.

In another aspect, as shown in FIG. 5, the pixel arrangement includes several Bayer-type pattern imagers and two sets of 3D TOF pixels. Essentially, one TOF pixel replaces one quadrant of a RGGB pixel design. In this configuration, the addition of several green pixels allows for the capture of more green wavelengths that may be needed for green color sensitivity, while at the same time capturing the infrared light for depth perception. In yet another aspect, FIG. 6 shows another possible arrangement of color pixels and 3D pixels according. The pixel arrangements in FIGS. 5 and 6 can be beneficial for, among other things, small pixel sizes. It should be noted that other arrangements are considered within the scope of the present disclosure.

Figure 7:
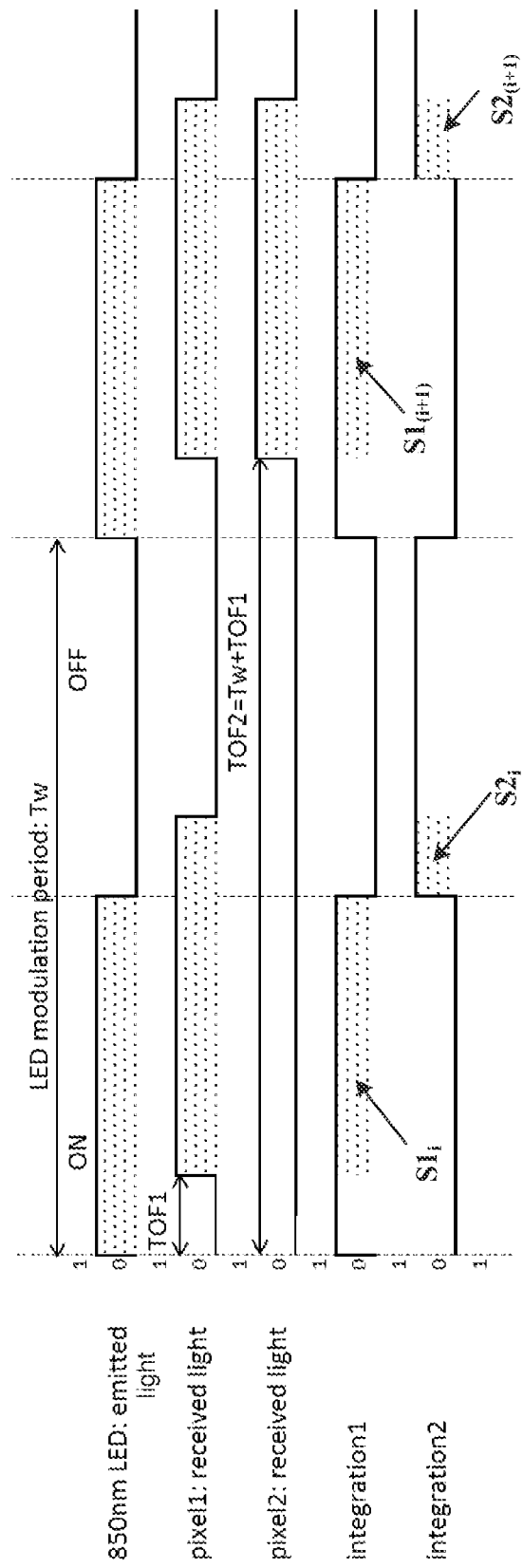
FIG. 7 is a timing schematic of basic TOF CMOS pixel operation principles in accordance with one aspect of the present disclosure.

A monolithic 3D sensor can be operated according to a variety of different schemes and architectures, and as such, the present scope should not be limited by the schemes and architectures described. For example, FIG. 7 shows schematically one potential operating scheme of a monolithic photosensitive 3D imager or 3D sensor according to one aspect. For a single 3D photodiode, the total integration time is divided into two alternate portions. Integration 1 is synchronized with the drive signal from the infrared light source, such as an LED. Integration 2 is opposite the drive signal of the LED. The signal of the received light can be split between integration 1 and integration 2. The integration cycle can be repeated several times before the accumulated signals are read out. The ratio between S1 and S2 can be used to derive the phase shift of received light relative to the emitted light as shown by Equations II, III, and IV:

$$S1 = \sum_1^N S1_i = S1_{LED} + S0 \qquad \text{II}$$

$$S2 = \sum_1^N S2_i = S2_{LED} + S0 \qquad \text{III}$$

$$d = \frac{c}{2} * \left[ \frac{Tw}{4} \frac{2S2_{LED}}{S1_{LED} + S2_{LED}} + n\left(\frac{Tw}{2}\right) \right], \qquad \text{IV}$$

where $n = 0, 1, 2, \ldots$

Where d is the distance to the object, Tw is the period of the LED modulation (in seconds, e.g. in Tw=1/f, f is the modulation frequency), $S1_{LED}$ and $S2_{LED}$ are signal levels caused by LED illumination, and c is the speed of light. In the above equation, the integer number represents the aliasing factor (e.g. ambiguity). S0 is the offset signal caused by ambient light and dark current of the pixel. The offset signal can be subtracted from the total signal to accurately derive the distance. The offset depends on the ambient light and ambient temperature at each location of the target (e.g. dark current). To derive the phase shift information, the offset must be known.

Known TOF methods can have accuracy issues (e.g. ambiguity issues). For example, the ambiguity distance value is cTw/4, which can be derived from the above equations. Thus, the derived phase shift of an object at a distance d is same as an object at a distance of d+n(cTw/4), where n=0, 1, 2 . . . . To resolve this issue, multiple LED modulation frequencies can be used to reduce ambiguity. In another aspect, the measurement can be limited to a distance of less than cTw/4 to avoid ambiguity.

Photosensitive imagers can be front side illumination (FSI) or back side illumination (BSI) devices. In a typical FSI imager, incident light enters the semiconductor device by first passing by transistors and metal circuitry. The light, however, scatters off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. BSI imagers, one the other hand, are configured to have the light sensing portion of the device opposite the circuitry. Incident light enters the device via the light sensing portion and is mostly absorbed prior to reaching the circuitry. BSI designs allow for smaller pixel architecture and a high fill factor for the imager. As mentioned, the devices according to aspects of the present disclosure can be adapted for either configuration. It should also be understood that devices according to aspects of the present disclosure can be incorporated into complimentary metal-oxide-semiconductor (CMOS) imager architectures or charge-coupled device (CCD) imager architectures.

Figure 8:
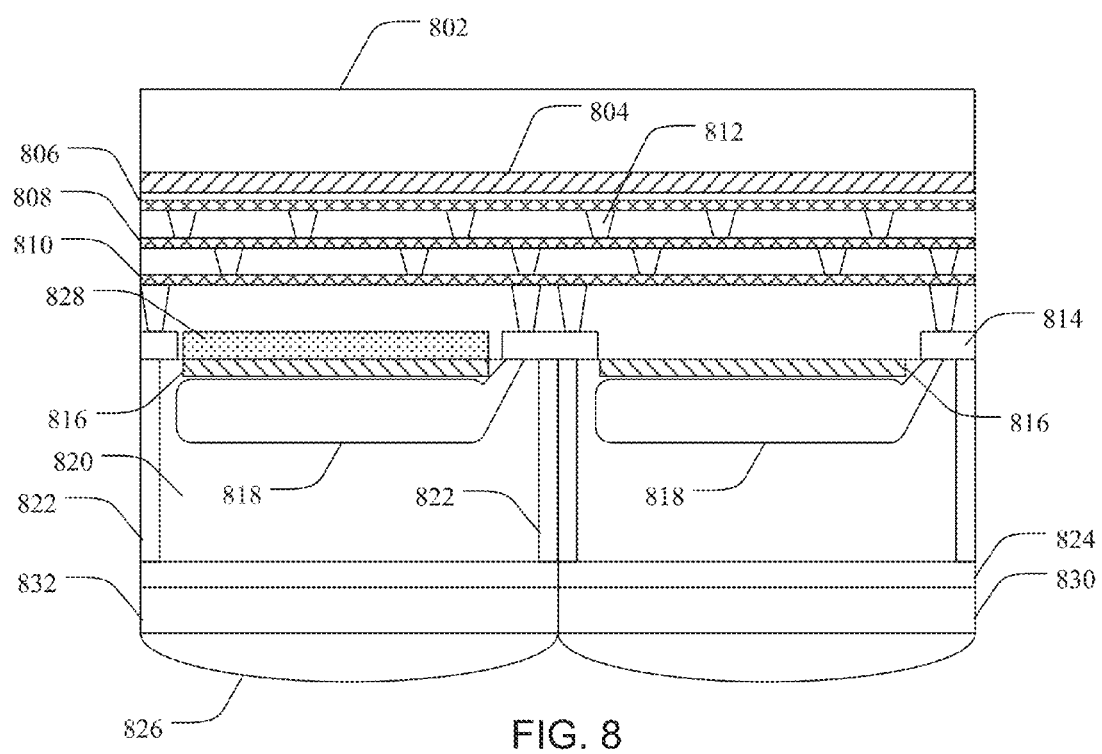
FIG. 8 is a cross-sectional view of a 3D TOF pixel and a visible (RGB) pixel in accordance with one aspect of the present disclosure.

One example of a monolithic 3D sensor is shown in FIG. 8, which illustrates a cross-sectional view of both a visible photodiode on the right and a 3D photodiode on the left. Both the visible and 3D photodiodes are designed in a BSI architecture. The BSI architecture can also be useful due to having improved QE response in the visible spectrum. The monolithic 3D sensor can include a carrier wafer 802, a dielectric layer 804, circuitry layers 806, 808 and 810, via(s) 812, and a transfer gate 814. The monolithic 3D sensor can further include a first doped region 816 (e.g. for this embodiment, p+), a second doped region 818 (e.g. for this embodiment, n-type), a semiconductor layer 820, a isolation feature 822, an anti-reflective layer 824, infrared filter and a lens 826 for focusing incident electromagnetic radiation. Furthermore, the 3D photodiode can have a quantum efficiency enhanced infrared light region 828. In some aspects, the visible light photodiode can also include a quantum efficiency enhanced infrared light region (not shown).

The 3D photodiode can also include an on-pixel optical narrow pass filter 832. The narrow pass filter design will match the modulated light source (e.g. LED or laser) emission spectrum. The narrow pass filter will significantly reduce the unwanted ambient light which will further increase the SNR of modulated NIR light. Another benefit of increased NIR QE is possibility of high frame rate operation for high speed 3D image capture. The visible pixel will have on-pixel color filter array (CFA) and IR cut filter. The integrated IR cut filter can allow high quality visible images with high fidelity color rendering. By integrating an infrared cut filter onto the sensor chip can also reduce total system costs (due to, for example, the removal infrared filter glass) and can reduce module profile. It is noted that the 3D photodiode can have a light absorbing properties and elements as has been disclosed in U.S. patent application Ser. No. 12/885,158, filed on Sep. 17, 2010, which is incorporated by reference in its entirety.

The photodiode (pixel) configured for detecting visible wavelengths can include the same elements as the 3D photodiode with the exception of having a color filter array (CFA) and an infrared cut filter 830. Notably, both the narrow pass NIR filter and IR cut filter can be made by a variety of multiple-layer interference type schemes. The on chip pixel level optical filter will allow high quality images for both the depth map and the color image.

Figure 9:
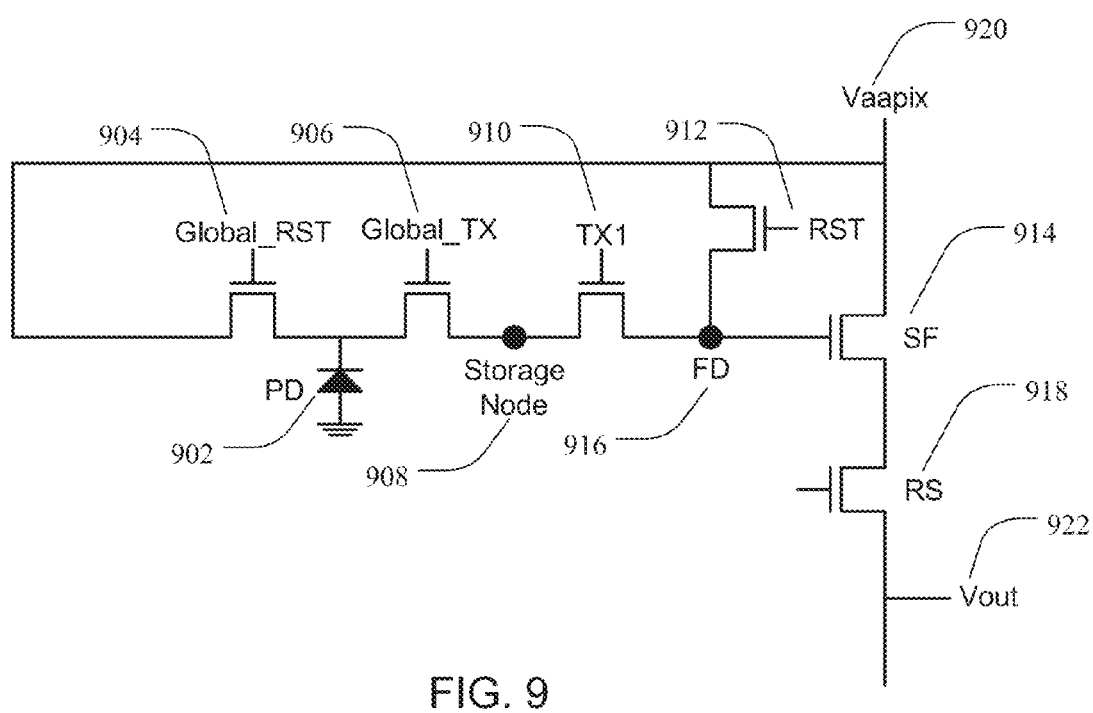
FIG. 9 is a schematic of a 6-transistor global shutter visible (RGB) pixel in accordance with one aspect of the present disclosure.

As has been described, the various photodiodes can have any number of transistors and transistor architectures. In one aspect, for example, the visible pixel can have a six-transistor (6-T) architecture that will allow global shutter operation. One example of such a 6-T architecture is shown in FIG. 9. This pixel architecture can include a photodiode (PD) 902, a global reset (Global_RST) 904, a global transfer gate (Global_TX) 906, a storage node 908, a transfer gate (TX1) 910, reset (RST) 912, source follower (SF) 914, floating diffusion (FD) 916, row select transistor (RS) 918, power supply (Vaapix) 920, and voltage out (Vout) 922. Due to the use of an extra transfer gate and storage node, correlated-double-sampling (CDS) is allowed. Therefore, the read noise should be similar to a typical CMOS 4T pixel.

Figure 10:
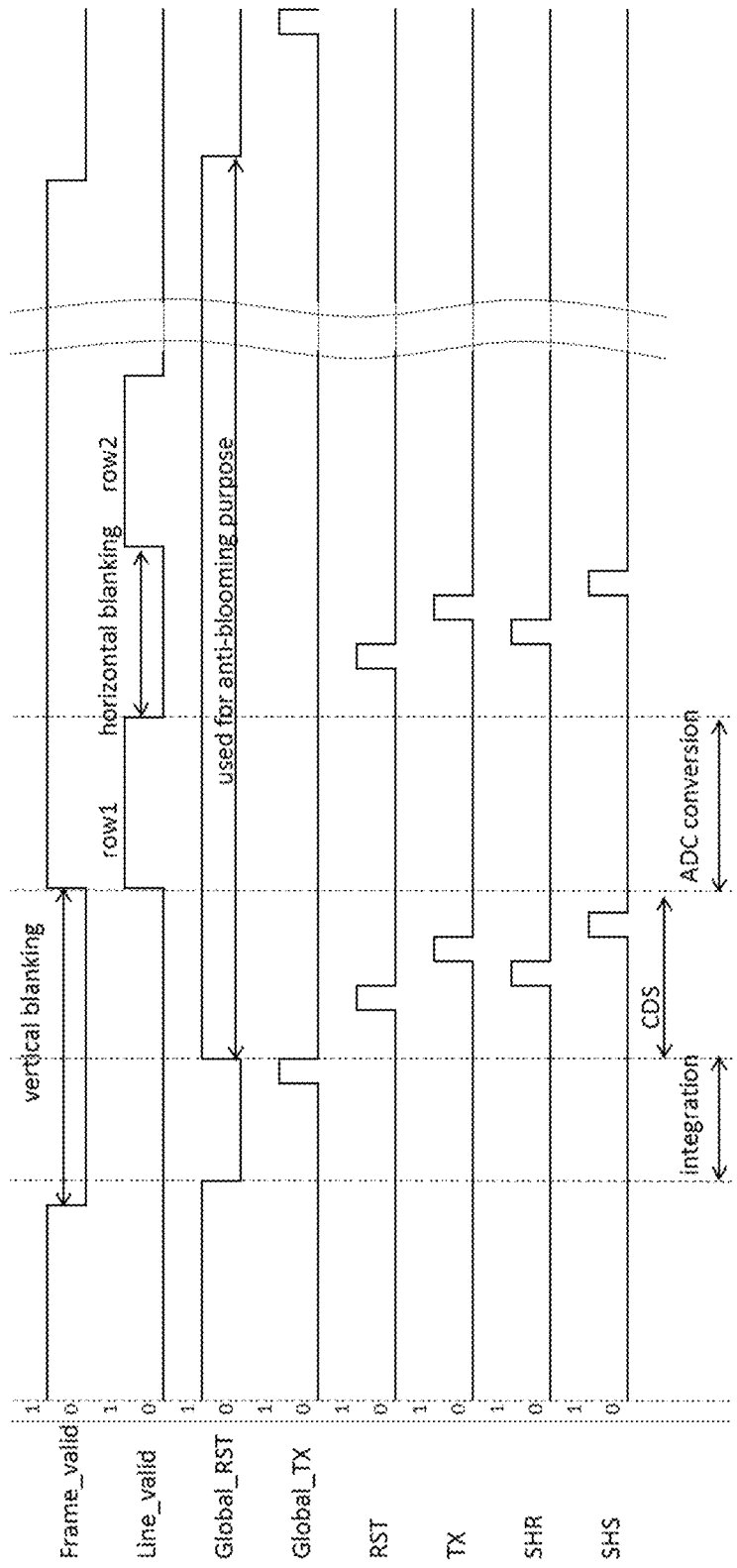
FIG. 10 is a timing diagram for a visible 6T global shutter pixel in accordance with one aspect of the present disclosure.

One example global shutter timing for short integration is shown in FIG. 10. In global shuttering, the Global_RST can be maintained at a high state for anti-blooming purposes. The Global_RST is set to a low state (or off) to begin integration of the pixel array. At the end of integration, Global_TX is pulsed to transfer the integrated charge from the photodiode 902 to the Storage Node 908 (FIG. 9) for each pixel in the array. After charge transfer, the Global_RST signal can be set to a high state again during the frame readout for anti-blooming purposes. The readout of each row can occur similar to a 4T pixel operation. The floating diffusion (FD) node 916 can be reset for sampling before the signal charge is transferred from the Storage Node. The function of correlated double sampling can then result in low read noise. More information regarding anti-blooming, global shuttering, correlated double sampling, and the like, can be found in U.S. patent Ser. No. 13/333,537, filed on Dec. 21, 2011, which is incorporated herein by reference.

Figure 11:
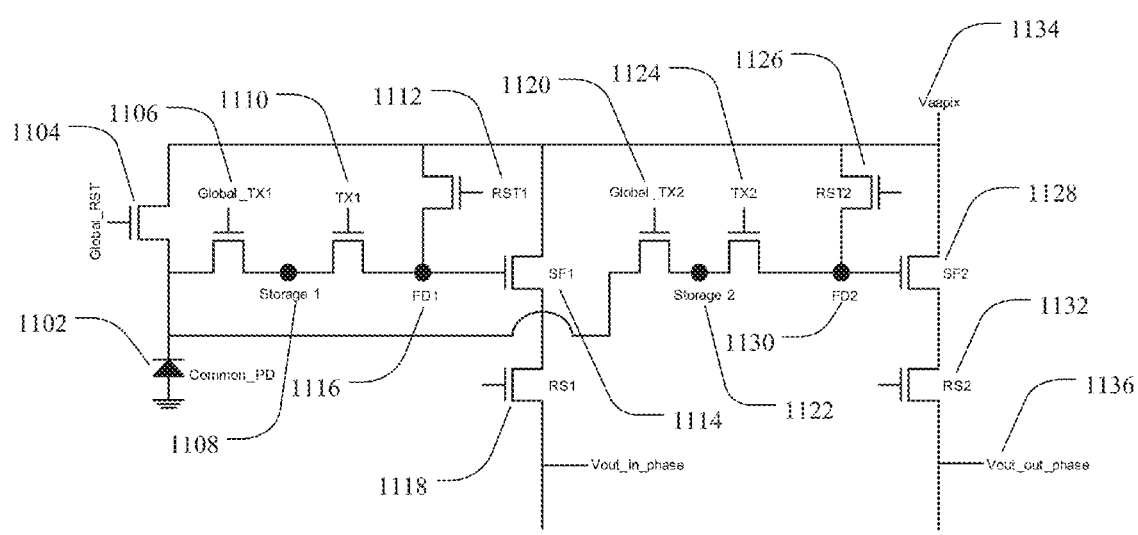
FIG. 11 is a schematic diagram for a 3D TOF global shutter CMOS pixel in accordance with one aspect of the present disclosure.

In another aspect, a schematic of a 3D pixel is shown in FIG. 11. This exemplary 3D pixel can include 11 transistors for accomplishing the depth measurement of the target. It should be noted that 11 transistors should not be seen as limiting, and other transistor architectures are contemplated. In this aspect, however, the 3D pixel can comprise a photodiode (PD) 1102, a global reset (Global_RST) 1104, a first global transfer gate (Global_TX1) 1106, a first storage node 1108, a first transfer gate (TX1) 1110, a first reset (RST1) 1112, a first source follower (SF1) 1114, a first floating diffusion (FD1) 1116, a first row select transistor (RS1) 1118, a second global transfer gate (Global_TX2) 1120, a second storage node 1122, a second transfer gate (TX2) 1124, a second reset (RST2) 1126, a second source follower (SF2) 1128, a second floating diffusion (FD2) 1130, a second row select transistor (RS2) 1132, power supply (Vaapix) 1134, and voltage out (Vout) 1136. Other transistors can be included in the 3D architecture and should be considered within the scope of the present disclosure. The specific aspect with 11 transistors can reduce motion artifacts due to the global shutter operation, thereby giving more accurate measurements.

Figure 12:
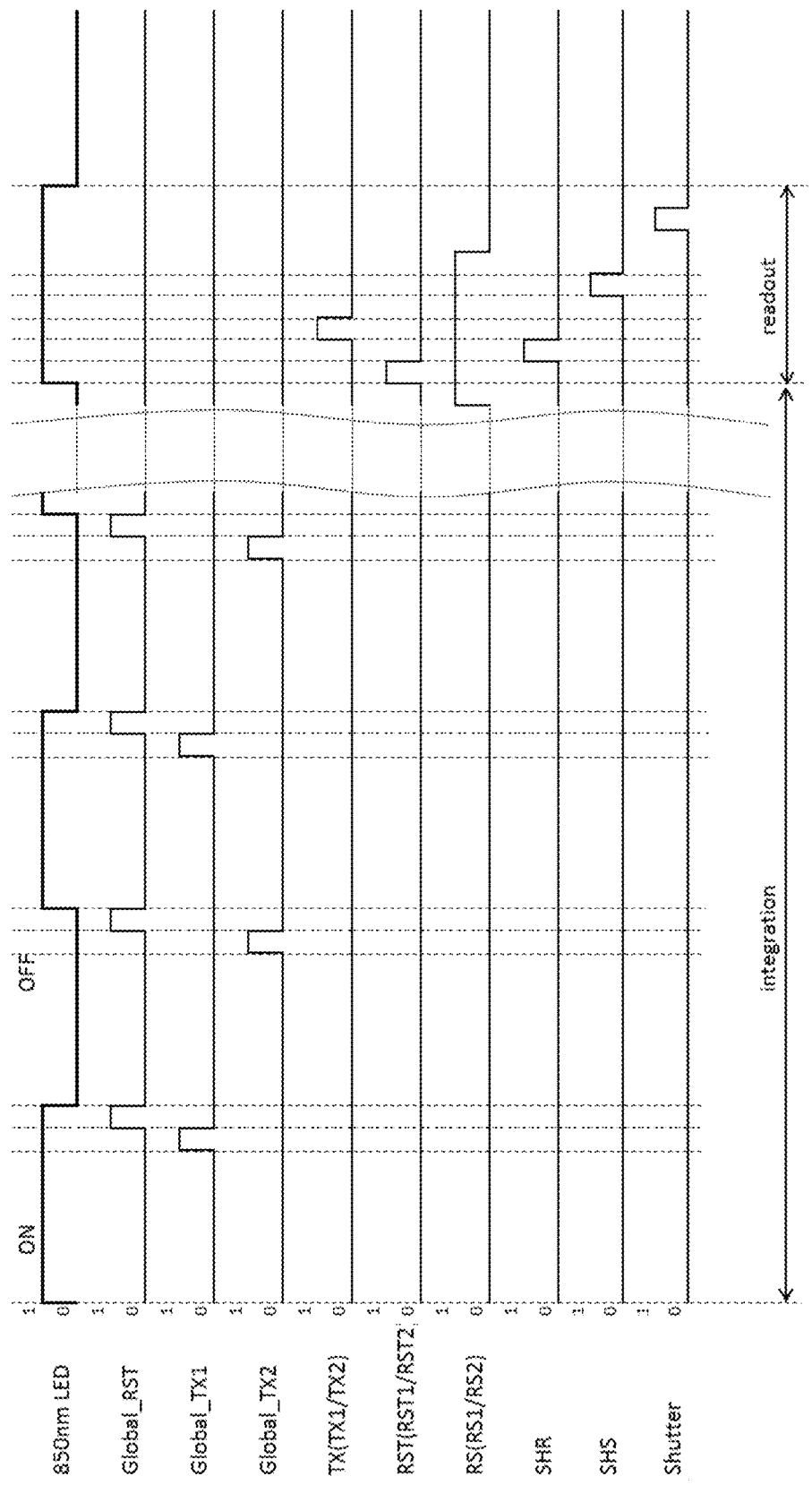
FIG. 12 is a timing diagram for 3D TOF pixel array in accordance with one aspect of the present disclosure.

The timing of a 3D pixel can be performed in a variety of ways, and as such, the following timing diagrams and description should not be seen as limiting, but merely exemplary methods of achieving a desired result. An exemplary timing diagram corresponding to the timing of the schematic of FIG. 11 is shown in FIG. 12. FIG. 12 shows the output of an 850 nm LED on a 50% duty cycle. The Global_RST is pulsed at the beginning and end of each LED cycle to reset the photodiode. Thus, as the LED is turned on the photodiode is reset and integration begins. Global_TX1 is pulsed at the end of the LED on phase to transfer the accumulated charge into Storage 1 and the photodiode is reset. Global_TX2 is pulsed at the end of the LED off cycle to transfer accumulated charge from the photodiode into Storage 2. Following a desired number of integration cycles, the charge in Storage 1 and Storage 2 are transferred to FD1 and FD2, read out using a global shutter mode, and compared to determine distance information.

Figure 13:
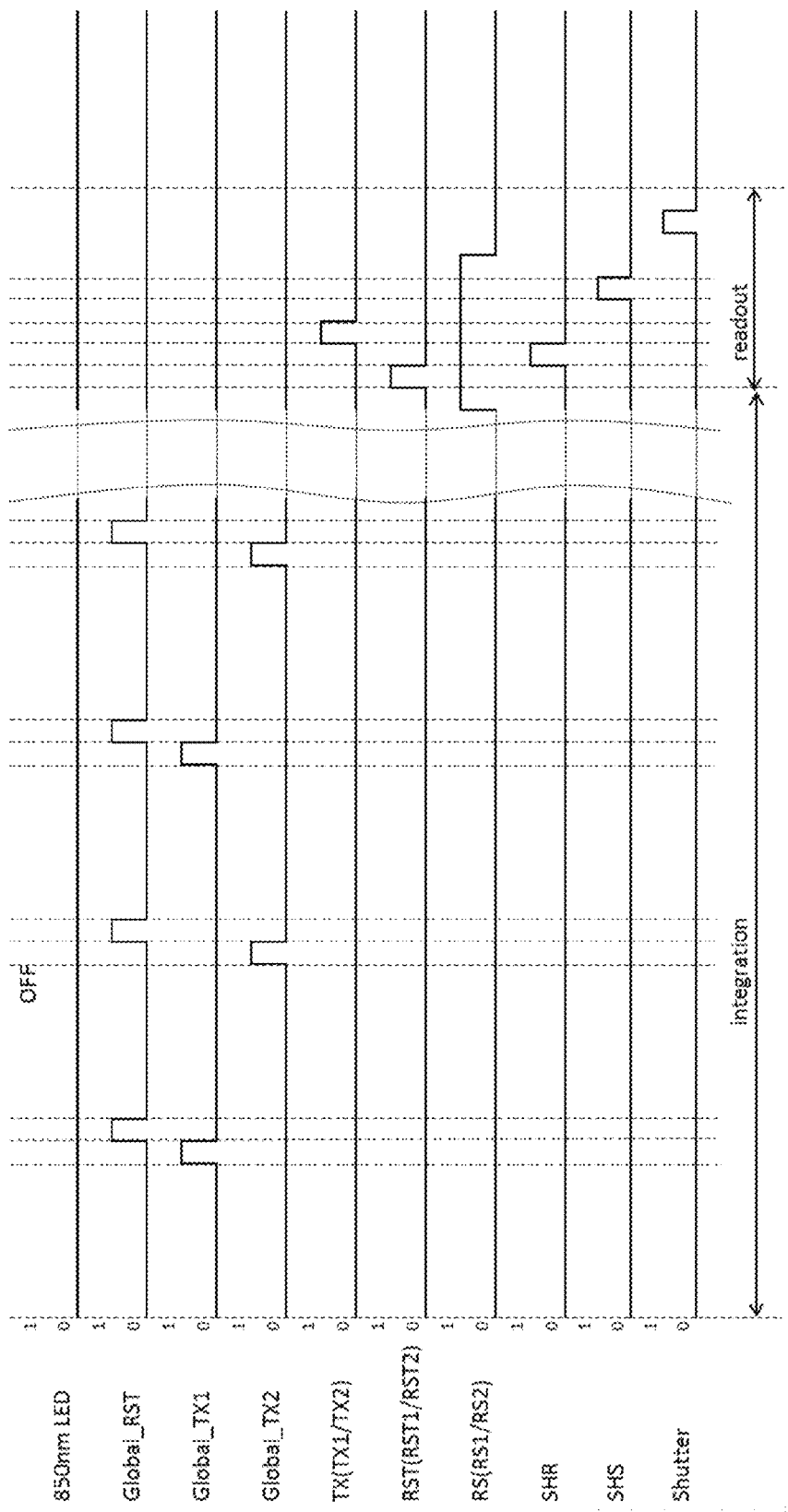
FIG. 13 is a timing diagram for a 3D TOF pixel array during background signal extraction in accordance with one aspect of the present disclosure.

In addition, the background infrared level can introduce errors into the distance measurement. This background signal can be measured and subtracted from the actual signal to provide a more accurate determination of distance. A timing diagram of one technique for making such a background measurement is shown in FIG. 13. The timing as shown in FIG. 12 is thus performed with the LED off, and the resulting background signal can be subtracted from the signal derived with the LED on to improve the distance measurement. The background measurement can be performed at any time with relation to the actual distance measurement. For example, in one aspect, the background measurement can be performed in between each global readout cycle. In another aspect, the background measurement can be performed at given time intervals, such as every second, every, 10 seconds, every 30 seconds, every minute, etc. Such a background reading can be taken whenever it is desirable to check the background infrared levels to improve sensor performance.

Figure 14:
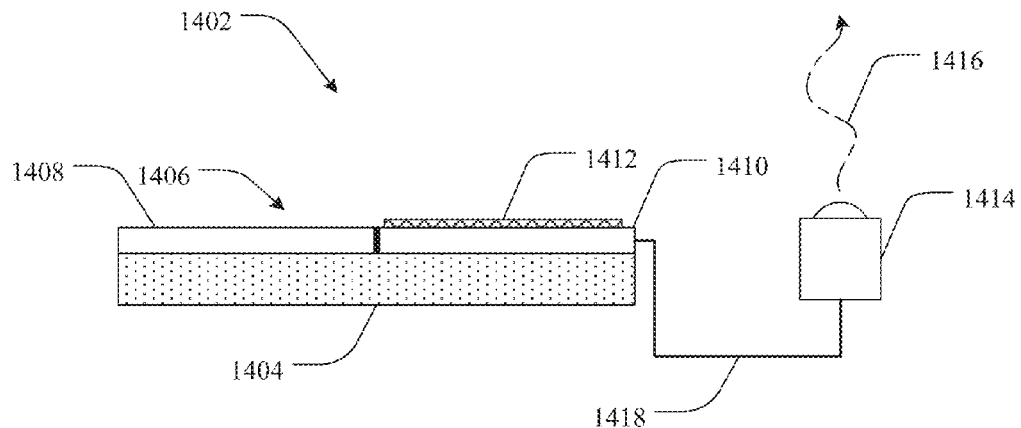
FIG. 14 is cross section view of a system including monolithic sensor in accordance with one aspect of the present disclosure.

The present disclosure additionally provides systems for detecting infrared and visible light. In one aspect, as is shown in FIG. 14 for example, such a system can include a monolithic 3D sensor 1402 for detecting infrared and visible light, comprising a semiconductor substrate 1404 having a device surface 1406, at least one visible light photodiode 1408 formed at the device surface, at least one 3D photodiode 1410 formed at the device surface in proximity to the at least one visible light photodiode, and a quantum efficiency enhanced infrared light region 1412 functionally coupled to the at least one 3D photodiode and positioned to interact with electromagnetic radiation. The system can further include an infrared light source 1414 operable to emit infrared light 1416 detectable by the 3D photodiode, and synchronization circuitry 1418 between the infrared light source and the 3D photodiode to synchronize detection of infrared light 3D photodiode with a pulse of the infrared light source.

Figure 15:
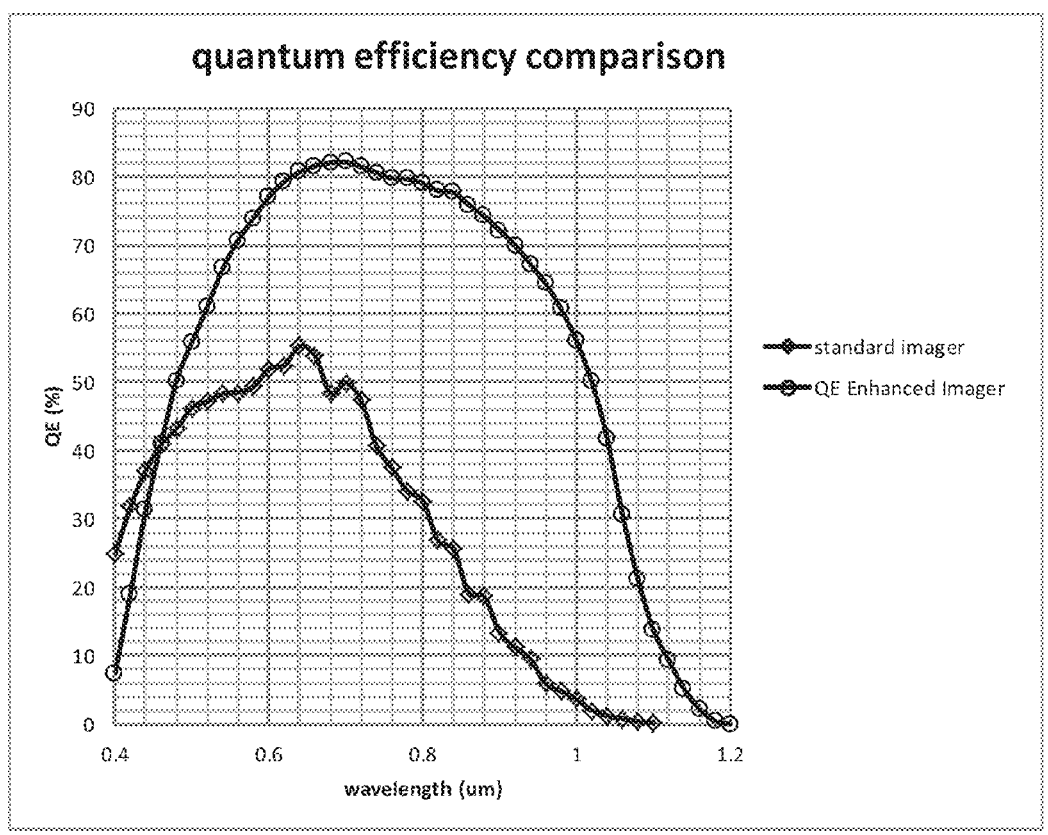
FIG. 15 is a graphical representation of a standard imager compared to a quantum efficiency enhanced imager in accordance with one aspect of the present disclosure.

The various devices according to aspects of the present disclosure exhibit increase quantum efficiencies (QE) as compared to traditional photodiode devices. On example of the QE improvements of such devices can be seen in the QE spectrum curve in FIG. 15. The curve in FIG. 15 shows a standard imager and an imager with enhanced quantum efficiency, especially in the infrared wavelengths. The QE enhanced imager and the standard imager both have comparable silicon thicknesses of about 5 µm. The thickness and responsivity of the QE enhanced imager can have significant impact on a 3D pixel operation, due to increased speed and detection. The increased QE can contribute to higher image signal to noise ratio (SNR), which will greatly reduce depth error. Further, increased QE on a silicon having a thickness of less than 5 µm can allow the pixel to reduce the diffusion component of the signal so that the charge collection and transfer can be increased, which is ideal for 3D pixel operation. In general, the photo-generated carriers created inside the pixel will depend on two mechanisms for collection: drift and diffusion. For light having shorter wavelengths, most of the carriers will be generated in a shallow region of the device and within the depletion region of the photodiode. Those carriers can be collected relatively quickly, via drift. For infrared light, however, the majority of photo carriers will be generated toward the backside of the silicon. These carriers will thus be generated outside diode's depletion region and will depend on diffusion to be collected. Diffusion is much slower than drift. For a 3D TOF pixel, fast sampling of photo charge is beneficial. High QE can be achieved within very thin (i.e. less than 5 µm) layers of epitaxially grown silicon using the techniques of the present disclosure. Therefore, most if not all carriers generated can be collected via the drift mechanism. This allows very fast charge collection and transfer. With this technology, depth resolution can be greatly increased due to the use of higher modulation frequencies of faster modulated infrared LEDs.

Photosensitive imagers can be maintained under constant conditions (fixed voltage or current) to provide enhanced linearity and uniformity. As has been described, connections between the imager and the device layers can be achieved using vias fabricated from a refractory metal, such as tungsten or tantalum. Placing storage elements under the imager may also provide various photonic benefits. For example, the entire pixel array may be dedicated to signal processing. This may enable higher performance by permitting access to low level pixel signals. Furthermore, massively parallel operations can be performed by pixel processors. For example, analog to digital conversion, noise reduction (i.e., true correlated double sampling), power conditioning, nearest neighbor pixel processing, compression, fusion, and color multiplexing operations can be performed.

Regarding the photodiodes themselves, a variety of semiconductor materials are contemplated for use with such devices. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInAsSb), gallium indium arsenide antimonide phosphide (GaInAsSbP), and combinations thereof.

Furthermore, the semiconductor device layer can be of any thickness that allows electromagnetic radiation detection and conversion functionality, and thus any such thickness of semiconductor device layer is considered to be within the present scope. In some aspects a textured region can be applied to the semiconductor device layer to increase the efficiency of the device such that the semiconductor device layer can be thinner than has previously been possible. Decreasing the thickness of the semiconductor reduces the amount of the often costly semiconductor material required to make such a device. In one aspect, for example, the semiconductor device layer has a thickness of from about 500 nm to about 50 μm. In another aspect, the semiconductor device layer has a thickness of less than or equal to about 500 μm. In yet another aspect, the semiconductor device layer has a thickness of from about 2 μm to about 10 μm. In a further aspect, the semiconductor device layer can have a thickness of from about 5 μm to about 750 μm. In yet a further aspect, the semiconductor device layer can have a thickness of from about 5 μm to about 100 μm. In other aspects, the semiconductor device layer can have a thickness of from about 2 μm to about 5 μm.

One effective method of producing a textured region (i.e. quantum efficiency enhanced infrared light region) is though laser processing. Such laser processing allows discrete locations of the semiconductor substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation, or the laser treated surface can be associated with a surface opposite in relation to impinging electromagnetic radiation, thereby allowing the radiation to pass through the semiconductor material before it hits the laser treated region.

In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a semiconductor material is irradiated with laser radiation to form a textured or surface modified region. Such laser processing can occur with or without a dopant material. In those aspects whereby a dopant is used, the laser can be directed through a dopant carrier and onto the semiconductor surface. In this way, dopant from the dopant carrier is introduced into the target region of the semiconductor material. Such a region incorporated into a semiconductor material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of semiconductor material includes exposing the laser radiation to a dopant such that irradiation incorporates the dopant into the semiconductor. Various dopant materials are known in the art, and are discussed in more detail herein.

Thus the surface of the semiconductor material is chemically and/or structurally altered by the laser treatment, which may, in some aspects, result in the formation of surface features appearing as microstructures or patterned areas on the surface and, if a dopant is used, the incorporation of such dopants into the semiconductor material. In some aspects, the surface features or microstructures can be on the order of 5 nm to 500 μm in size and can assist in the absorption of electromagnetic radiation. In other words, the textured surface can increase the probability of incident radiation being absorbed by the semiconductor material. In another aspect, the surface features can be from about 10 nm to about 20 μm in size.

The type of laser radiation used to surface modify a semiconductor material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a semiconductor material. A short-pulsed laser is one capable of producing femtosecond or picosecond pulse durations. Laser pulses can have a central wavelength in a range of about from about 10 nm to about 8 μm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths are in the range of from about 50 femtoseconds to 500 femtoseconds.

The number of laser pulses irradiating a target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 μHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

It should be noted that other techniques for texturing the quantum efficiency enhanced infrared light region are considered to be within the present scope. Non-limiting examples include chemical etching, physical abrasion, material deposition, and the like.

A variety of dopant materials are contemplated, and any such material that can be used in the laser treatment process to surface modify a semiconductor material according to aspects of the present disclosure is considered to be within the present scope. It should be noted that the particular dopant utilized can vary depending on the semiconductor material being laser treated, as well as the intended use of the resulting semiconductor material. For example, the selection of potential dopants may differ depending on whether or not tuning of the photosensitive device is desired. Additionally, such dopant can be utilized in the textured region or in the other various doped regions of the device.

A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ and about $1\times10^{16}$ ions/cm$^2$. Non-limiting examples of fluorine-containing compounds can include $ClF_3$, $PF_5$, $F_2SF_6$, $BF_3$, $GeF_4$, $WF_6$, $SiF_4$, $HF$, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, $BN$, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, $HCl$, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0\times10^{-8}$ mol/cm$^3$ to about $5.0\times10^{-4}$ mol/cm$^3$. $SF_6$ gas is a good carrier for the incorporation of sulfur into the semiconductor material via a laser process without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

Additionally, the semiconductor device layer can be annealed for a variety of reasons, including dopant activation, semiconductor material repair, and the like. In those aspects including a laser textured region, the semiconductor material can be annealed prior to laser treatment, following laser treatment, during laser treatment, or both prior to and following laser treatment. Annealing can enhance the semiconductive properties of the device, including increasing the photoresponse properties of the semiconductor materials. Additionally, annealing can reduce damage done by the lasing process.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A monolithic 3D sensor capable of detecting infrared and visible light, comprising:
   a semiconductor substrate having a device surface;
   at least one visible light photodiode formed at the device surface;
   at least one 3D photodiode formed at the device surface in proximity to the at least one visible light photodiode; and
   a quantum efficiency enhanced infrared light region functionally coupled to the at least one 3D photodiode and positioned to interact with electromagnetic radiation.

2. The sensor of claim 1, wherein the quantum efficiency enhanced infrared light region is a textured region located at the device surface.

3. The sensor of claim 1, wherein the quantum efficiency enhanced infrared light region is a textured region located on a side of the semiconductor substrate opposite the device surface.

4. The sensor of claim 1, wherein the quantum efficiency enhanced infrared light region has surface structures formed using a pulsed laser with a pulse duration of from about 1 femtosecond to about 500 picoseconds.

5. The sensor of claim 4, wherein the surface structures have an average height of from about 5 nm to about 500 µm.

6. The sensor of claim 1, wherein the at least one visible light photodiode includes at least one red light-sensitive photodiode, at least one blue light-sensitive photodiode, at least one green light-sensitive photodiode, and at least one 3D photodiode.

7. The sensor of claim 1, wherein the 3D photodiode is operable to detect infrared light having a wavelength of greater than about 800 nm.

8. The sensor of claim 1, further comprising an infrared narrow bandpass filter optically coupled to the 3D photodiode and positioned to filter electromagnetic radiation impinging on the 3D photodiode.

9. The sensor of claim 1, further comprising an infrared cut filter optically coupled to the at least one visible light diode and positioned to filter infrared electromagnetic radiation impinging on the at least one visible light photodiode.

10. The sensor of claim 1, wherein the 3D photodiode further includes circuitry for capturing signals generated by the 3D photodiode in response to detection of a pulse of infrared light from an infrared light source.

11. The sensor of claim 1, wherein the 3D photodiode further includes circuitry for calculating time of flight information.

12. The sensor of claim 1, further comprising circuitry for synchronizing light capture of the 3D photodiode with an infrared light source.

13. The sensor of claim 1, further comprising readout circuitry functionally coupled to the at least one visible light photodiode and the at least one 3D photodiode operable to function in global shutter mode.

14. The sensor of claim 1, wherein the sensor is configured as a backside illuminated sensor.

15. A system for detecting infrared and visible light, comprising:
   a monolithic 3D sensor for detecting infrared and visible light, comprising:
      a semiconductor substrate having a device surface;
      at least one visible light photodiode formed at the device surface;
      at least one 3D photodiode formed at the device surface in proximity to the at least one visible light photodiode; and
      a quantum efficiency enhanced infrared light region functionally coupled to the at least one 3D photodiode and positioned to interact with electromagnetic radiation;
   an infrared light source operable to emit infrared light detectable by the 3D photodiode; and
   synchronization circuitry between the infrared light source and the 3D photodiode to synchronize detection of infrared light 3D photodiode with a pulse of the infrared light source.

16. The system of claim 15, wherein the quantum efficiency enhanced infrared light region is a textured region located at the device surface.

17. The system of claim 15, wherein the quantum efficiency enhanced infrared light region has surface structures formed using a pulsed laser with a pulse duration of from about 1 femtosecond to about 500 picoseconds.

18. The system of claim 17, wherein the surface structures have an average height of from about 5 nm to about 500 μm.

19. The system of claim 15, wherein the at least one visible light photodiode includes at least one red light-sensitive photodiode, at least one blue light-sensitive photodiode, at least one green light-sensitive photodiode, and at least two 3D photodiodes.

20. The system of claim 15, wherein the 3D photodiode is operable to detect the infrared light from the infrared light source.

21. The system of claim 20, further comprising an infrared narrow bandpass filter optically coupled to the 3D photodiode and positioned to filter electromagnetic radiation impinging on the 3D photodiode, wherein the infrared narrow bandpass filter has a pass band substantially matching the infrared light frequency.

22. The system of claim 15, further comprising an infrared cut filter optically coupled to the at least one visible light diode and positioned to filter infrared electromagnetic radiation impinging on the at least one visible light photodiode.

23. The system of claim 15, wherein the 3D photodiode further includes circuitry for capturing signals generated by the 3D photodiode in response to detection of a pulse of the infrared light from the infrared light source.

24. The system of claim 15, further comprising circuitry for synchronizing light capture of the 3D photodiode with the infrared light generated by the infrared light source.

\* \* \* \* \*